US011728235B2

(12) United States Patent
Yamamoto et al.

(10) Patent No.: US 11,728,235 B2
(45) Date of Patent: Aug. 15, 2023

(54) SEMICONDUCTOR DEVICE AND METHOD FOR MANUFACTURING SEMICONDUCTOR DEVICE

(71) Applicant: Murata Manufacturing Co., Ltd., Kyoto-fu (JP)

(72) Inventors: Teiji Yamamoto, Nagaokakyo (JP); Masayuki Aoike, Nagaokakyo (JP); Hiroyuki Nagai, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/997,767

(22) Filed: Aug. 19, 2020

(65) Prior Publication Data
US 2020/0381324 A1   Dec. 3, 2020

Related U.S. Application Data

(63) Continuation of application No. PCT/JP2019/004853, filed on Feb. 12, 2019.

(30) Foreign Application Priority Data

Feb. 20, 2018   (JP) ................................. 2018-028214

(51) Int. Cl.
*H01L 23/29* (2006.01)
*H01L 23/31* (2006.01)
(Continued)

(52) U.S. Cl.
CPC ........ *H01L 23/3121* (2013.01); *H01L 21/568* (2013.01); *H01L 23/3135* (2013.01);
(Continued)

(58) Field of Classification Search
CPC ........... H01L 23/3121; H01L 23/49827; H01L 23/66; H01L 25/0652; H01L 2223/6644
(Continued)

(56) References Cited

U.S. PATENT DOCUMENTS 6,372,561 B1 * 4/2002 Yu .......................... H01L 29/458
  257/E29.147
7,256,431 B2 * 8/2007 Okamoto .............. C23C 28/345
  257/177
(Continued)

FOREIGN PATENT DOCUMENTS

JP   H11-087576 A     3/1999
JP   2007-335742 A    12/2007
(Continued)

OTHER PUBLICATIONS

International Search Report issued in PCT/JP2019/004853; dated Apr. 23, 2019.
(Continued)

*Primary Examiner* — Nitin Parekh
(74) *Attorney, Agent, or Firm* — Studebaker & Brackett PC

(57) ABSTRACT

A semiconductor device and a method for manufacturing a semiconductor device that enable characteristics to be improved are provided. A semiconductor device includes a substrate that has a first surface and a second surface that is located opposite the first surface, a first element that is disposed on the first surface, and a first resin layer that is disposed on the first surface and that is disposed around the first element in a plan view. The substrate includes a wiring layer. The first element includes a semiconductor layer, an electrode portion that is located on a surface of the semiconductor layer facing the substrate, and an insulating layer that is located opposite the electrode portion with the semiconductor layer interposed therebetween. The electrode portion is connected to the wiring layer. A height of the first resin layer from the first surface is more than a height of the first element from the first surface.

19 Claims, 11 Drawing Sheets

(51) Int. Cl.
H01L 21/56 (2006.01)
H01L 23/498 (2006.01)
H01L 23/66 (2006.01)
H01L 23/00 (2006.01)
H01L 25/065 (2023.01)

(52) U.S. Cl.
CPC ........ *H01L 23/49827* (2013.01); *H01L 23/66* (2013.01); *H01L 24/13* (2013.01); *H01L 25/0652* (2013.01); *H01L 2223/6644* (2013.01)

(58) Field of Classification Search
USPC .................................. 257/790, 787, 783
See application file for complete search history.

(56) References Cited

U.S. PATENT DOCUMENTS

| | | | | |
|---|---|---|---|---|
| 8,288,865 | B2* | 10/2012 | Suzuki | H01L 24/11 |
| | | | | 257/737 |
| 2010/0059854 | A1* | 3/2010 | Lin | H01L 21/6835 |
| | | | | 257/E27.114 |
| 2016/0100489 | A1* | 4/2016 | Costa | H01L 25/0655 |
| | | | | 361/764 |
| 2016/0126381 | A1* | 5/2016 | Wang | H01L 31/028 |
| | | | | 257/429 |
| 2017/0117260 | A1* | 4/2017 | Prabhu | H01L 24/20 |
| 2017/0188458 | A1* | 6/2017 | Hsieh | H05K 1/115 |
| 2019/0189572 | A1* | 6/2019 | Chiang | H01L 23/5226 |

FOREIGN PATENT DOCUMENTS

| | | |
|---|---|---|
| JP | 2015-195263 A | 11/2015 |
| JP | 2017-103426 A | 6/2017 |
| WO | 2011/008894 A2 | 1/2011 |
| WO | 2014/020783 A1 | 2/2014 |

OTHER PUBLICATIONS

International Preliminary Report on Patentability and Written Opinion issued in PCT/JP2019/004853; dated Aug. 27, 2020.

* cited by examiner

SEMICONDUCTOR DEVICE AND METHOD FOR MANUFACTURING SEMICONDUCTOR DEVICE

CROSS-REFERENCE TO RELATED APPLICATIONS

This application claims benefit of priority to International Patent Application No. PCT/JP2019/004853, filed Feb. 12, 2019, and to Japanese Patent Application No. 2018-028214, filed Feb. 20, 2018, the entire contents of each are incorporated herein by reference.

BACKGROUND

Technical Field

The present disclosure relates to a semiconductor device and a method of a manufacturing a semiconductor device.

Background Art

A known SOI (Silicon on Insulator) substrate includes a semiconductor layer, an insulating layer, and a support substrate. A known semiconductor device includes, for example, a MOS transistor that is disposed in the semiconductor layer of the SOI substrate, as described, for example, International Publication No. 2011/008894.

SUMMARY

In the SOI substrate, a stray capacitance occurs between the semiconductor layer and the support substrate with the insulating layer interposed therebetween. There is a possibility that the SOI substrate includes an electric charge accumulation layer along the interface between the semiconductor layer and the insulating layer. There is a possibility that the stray capacitance and the electric field accumulation layer described above prevent the characteristics of the semiconductor device from being improved.

The present disclosure has been accomplished in view of the above circumstances, and provides a semiconductor device and a method for manufacturing a semiconductor device that enable the characteristics thereof to be improved.

A semiconductor device according to an aspect includes a substrate that has a first surface and a second surface that is located opposite the first surface, a first element that is disposed on the first surface, and a first resin layer that is disposed on the first surface and that is disposed around the first element in a plan view. The substrate includes a wiring layer. The first element includes a semiconductor layer, an electrode portion that is located on a surface of the semiconductor layer facing the substrate, and an insulating layer that is located opposite the electrode portion with the semiconductor layer interposed therebetween. The electrode portion is connected to the wiring layer. A height of the first resin layer from the first surface is more than a height of the first element from the first surface.

A method for manufacturing a semiconductor device according to an aspect is a method for manufacturing the semiconductor device by using an element that includes a support substrate, an insulating layer that is disposed on a surface of the support substrate, a semiconductor layer that is disposed opposite the support substrate with the insulating layer interposed therebetween, and an electrode portion that is disposed opposite the insulating layer with the semiconductor layer interposed therebetween. The method includes a step of connecting the electrode portion to a wiring layer of a substrate such that the semiconductor layer faces a first surface of the substrate, a step of forming a first resin layer on the first surface of the substrate and covering the element, and a step of grinding the first resin layer and exposing the support substrate, and a step of etching and removing the support substrate that is exposed from the first resin layer.

According to the present disclosure, a semiconductor device and a method for manufacturing a semiconductor device that enable the characteristics thereof to be improved can be provided.

DETAILED DESCRIPTION

Figure 1:
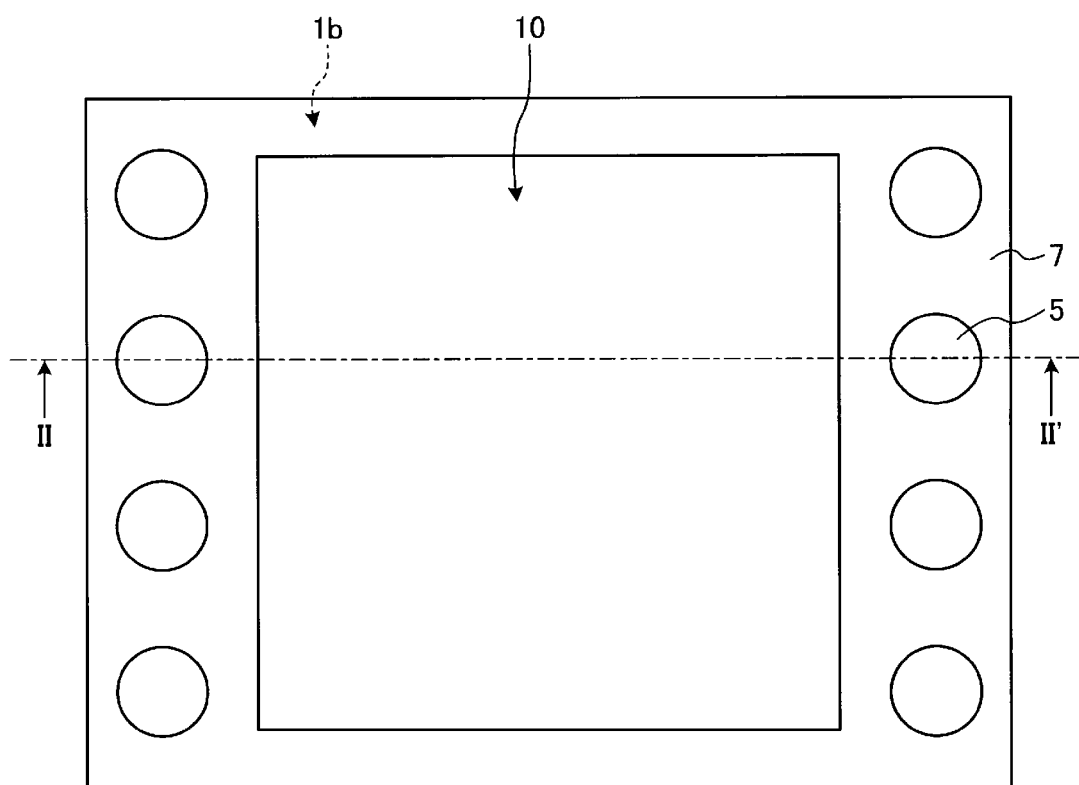
FIG. 1 is a plan view of an example of the structure of a semiconductor device according to a first embodiment.

Aspects (embodiments) for carrying out the present disclosure will hereinafter be described in detail with reference to the drawings. Contents described according to the embodiments below do not limit the present disclosure. Components described below include components that the person skilled in the art can readily presume and substantially the same components. The components described below can be appropriately combined. In the present specification and the drawings, components like to components that are already mentioned regarding the already mentioned drawings are designated by like reference characters, and a detailed description thereof is appropriately omitted in some cases.

First Embodiment

Figure 2:
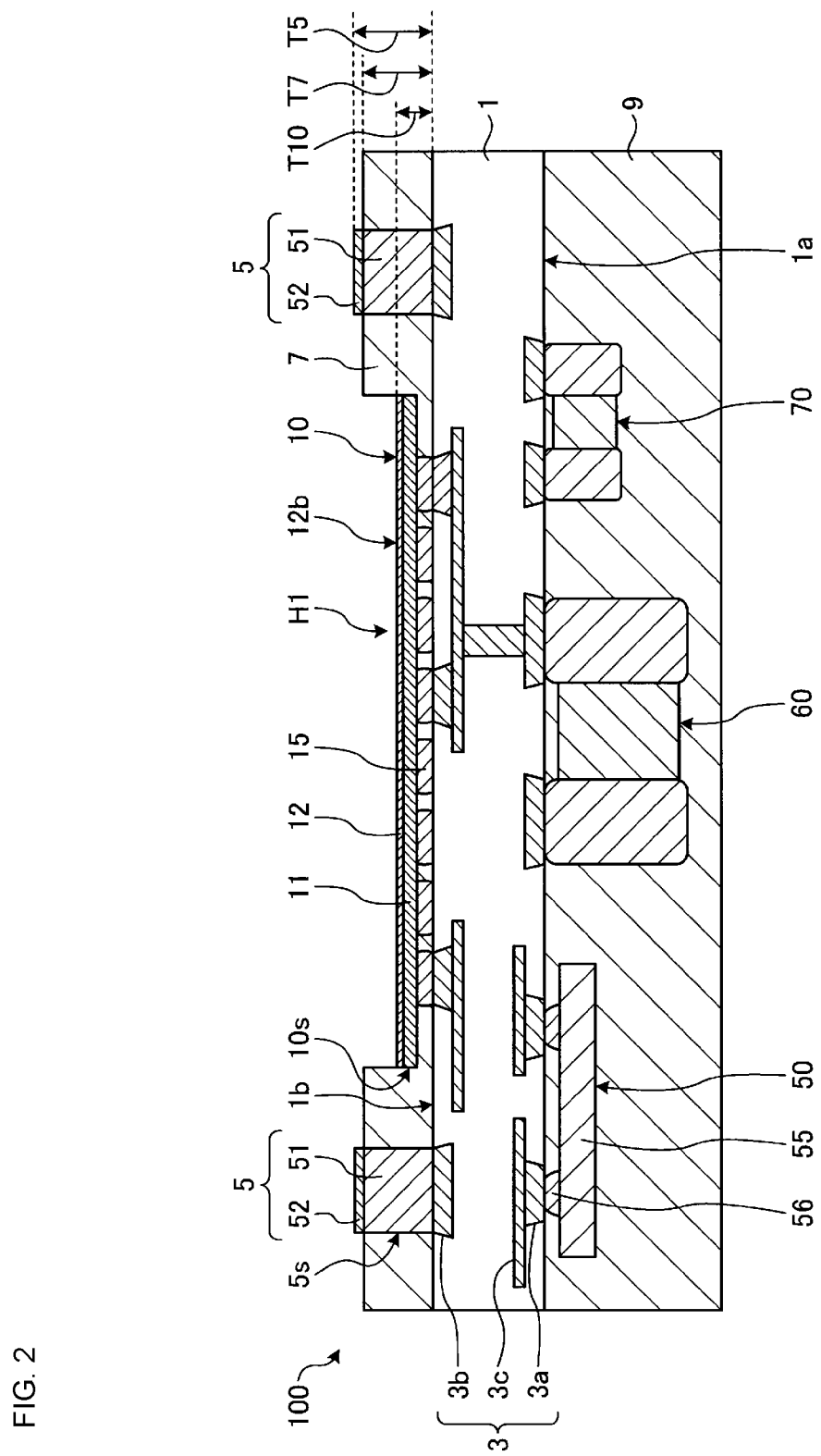
FIG. 2 is a sectional diagram taken along line II-If in the plan view illustrated in FIG. 1.

FIG. 1 is a plan view of an example of the structure of a semiconductor device according to a first embodiment. FIG. 2 is a sectional diagram taken along line II-If in the plan view illustrated in FIG. 1. An semiconductor device 100 is, for example, a semiconductor device that is used at a radio frequency and that amplifies a radio-frequency input signal for output. For example, the semiconductor device 100 is a transmission unit that is used in a mobile communication device such as a cellular phone to transmit various kinds of signals such as voice and data to a base station. As illustrated in FIG. 1 and FIG. 2, the semiconductor device 100 according to the first embodiment includes a circuit substrate 1, external connection terminals 5, a first resin layer 7, a second resin layer 9, a first semiconductor element 10, a second semiconductor element 50, a first surface mount device component (referred to below as a SMD (Surface Mount Device) component) 60, and a second SMD component 70.

The circuit substrate 1 is composed of a dielectric material and metal, and an example thereof is a glass epoxy substrate that includes a wiring layer 3. The circuit substrate 1 has a front surface 1a and a back surface 1b that is located opposite the front surface 1a. According to the present disclosure, the back surface 1b is also referred to as a first surface, and the front surface 1a is also referred to as a second surface in some cases. The wiring layer 3 includes a first wiring layer 3a that is disposed in the front surface 1a, a second wiring layer 3b that is disposed in the back surface 1b, and a third wiring layer 3c that is disposed between the front surface 1a and the back surface 1b. The third wiring layer 3c may be a single layer or may be a multilayer. A part of the first wiring layer 3a is connected to a part of the second wiring layer 3b with the third wiring layer 3c interposed therebetween.

The first semiconductor element 10 is mounted on the back surface 1b of the circuit substrate 1 by surface mounting. According to the present disclosure, the first semiconductor element 10 is also referred to as a first element in some cases. The first semiconductor element 10 includes a semiconductor layer 11, an insulating layer 12, and a bump electrode 15. The semiconductor layer 11 includes an integrated circuit (IC). The integrated circuit includes an active element such as a transistor and a passive element such as a resistor or a capacitor. An example of the semiconductor layer 11 is a single-crystal silicon layer (Si). The semiconductor layer 11 is also called an active layer. The insulating layer 12 is disposed opposite a surface of the semiconductor layer 11 facing the bump electrode 15. That is, the insulating layer 12 is located opposite the bump electrode 15 with the semiconductor layer 11 interposed therebetween. The insulating layer 12 is composed of an oxide of a semiconductor of which the semiconductor layer 11 is composed, and an example thereof is silicon oxide film ($SiO_2$). The insulating layer 12 is also called a BOX layer.

The bump electrode 15 is located between the semiconductor layer 11 and the circuit substrate 1 and is connected to the second wiring layer 3b of the circuit substrate 1. The bump electrode 15 is used for power supply input or signal input from the circuit substrate 1 to the first semiconductor element 10. The bump electrode 15 is also used for single output from the first semiconductor element 10 to the circuit substrate 1. The bump electrode 15 is composed of, for example, a metal material such as solder.

The first semiconductor element 10 is formed, for example, by removing a support substrate 13 (see FIG. 3) of a SOI substrate as described later. Consequently, the first semiconductor element 10 is thinner than the second semiconductor element 50. Accordingly, the first semiconductor element 10 can also be referred to as a thin-layer semiconductor element.

The external connection terminals 5 are mounted on the back surface 1b of the circuit substrate 1 and are connected to the second wiring layer 3b in the back surface 1b of the circuit substrate 1. Each external connection terminal 5 includes a metal layer 51, and a plating layer 52 that covers the metal layer 51. For example, the metal layer 51 is composed of copper (Cu). The plating layer 52 has a multilayer structure of nickel (Ni) and gold (Au) that are stacked in this order from the metal layer 51.

The first resin layer 7 is disposed on the back surface 1b of the circuit substrate 1. The first resin layer 7 surrounds the circumference of the first semiconductor element 10 with no gap. For example, the first resin layer 7 continuously surrounds the circumference of the first semiconductor element 10 in a plan view. The first resin layer 7 is in close contact with the whole of side surfaces 10s of the first semiconductor element 10. Consequently, the first semiconductor element 10 is supported by the first resin layer 7 sideways. The semiconductor layer 11 of the first semiconductor element 10 is sealed by the first resin layer 7. In the present specification, a plan view means a view from the direction of a normal to the back surface 1b of the circuit substrate 1.

The first resin layer 7 surrounds the circumferences of the external connection terminals 5 with no gap. For example, the first resin layer 7 continuously surrounds the circumferences of the external connection terminals 5 in a plan view. The first resin layer 7 is in close contact with side surfaces 5s of the external connection terminals 5. Consequently, the external connection terminals 5 are supported by the first resin layer 7 sideways.

The first resin layer 7 is filled between the first semiconductor element 10 and the circuit substrate 1 and covers the side surfaces of the bump electrode 15. Consequently, the first semiconductor element 10 is supported by the first resin layer 7 in a direction from the circuit substrate 1. The first resin layer 7 is composed of a low dielectric constant material having a relative dielectric constant of 4 or less. For example, the first resin layer 7 is composed of thermosetting epoxy resin.

A portion of the first resin layer 7 that is located around the first semiconductor element 10 is also referred to as a resin dam. As illustrated in FIG. 2, a surface (referred to below as an upper surface) 12b of the insulating layer 12 opposite the surface facing the circuit substrate 1 and the plating layer 52 of each external connection terminal 5 are exposed from the resin dam.

The height of the first semiconductor element 10 from the back surface 1b is designated by T10. The height of the resin dam from the back surface 1b is designated by T7. The height of each external connection terminal 5 from the back surface 1b is designated by T5. The height T7 of the resin dam from the back surface 1b is more than the height T10 of the first semiconductor element 10 from the back surface 1b. The height T5 of each external connection terminal 5 from the back surface 1b is equal to the height T7 of the resin dam from the back surface 1b or more than the height T7. That is, according to the present embodiment, relationships among the magnitudes of the heights T10, T7, and T5 satisfy $T10<T7 \leq T5$.

Due to the relationships among the magnitudes, the first resin layer 7 has a recessed portion (hollow) H1 that is surrounded by the resin dam. At the bottom of the recessed portion H1, the upper surface 12b of the insulating layer 12 is exposed. For example, the bottom surface of the recessed portion H1 corresponds to the upper surface 12b of the insulating layer 12. The plating layer 52 of each external connection terminal 5 is flush with the resin dam or protrudes from the resin dam.

As illustrated in FIG. 2, the second semiconductor element 50 is mounted on the front surface 1a of the circuit substrate 1 by surface mounting. According to the present disclosure, the second semiconductor element 50 is also referred to as a second element in some cases. The second semiconductor element 50 includes a semiconductor substrate 55 and a bump electrode 56. An example of the semiconductor substrate 55 is a single-crystal Si substrate and includes an integrated circuit. The bump electrode 56 is located between the semiconductor substrate 55 and the circuit substrate 1 and is connected to the first wiring layer 3a of the circuit substrate 1. The bump electrode 56 is used for power supply input or signal input from the circuit substrate 1 to the second semiconductor element 50. The bump electrode 56 is also used for single output from the second semiconductor element 50 to the circuit substrate 1. The bump electrode 56 is composed of, for example, a metal material such as solder.

The first SMD component 60 and the second SMD component 70 are mounted on the front surface 1a of the circuit substrate 1. According to the present disclosure, the first SMD component 60, the second SMD component 70, or each of these is also referred to as the second element in some cases. The first SMD component 60 and the second SMD component 70 are electronic components, and the kinds thereof are not particularly limited. For example, the first SMD component 60 and the second SMD component 70 are discrete semiconductors. Examples of the discrete semiconductors include a capacitor, a transistor, a diode, a MOSFET (Metal Oxide Semiconductor Field Effect Transistor), and an IGBT (Insulated Gate Bipolar Transistor). The first SMD component 60 and the second SMD component 70 may be capacitor elements or resistance elements. The first SMD component 60 and the second SMD component 70 are not limited to Si semiconductor devices. The first SMD component 60 and the second SMD component 70 may be compound semiconductor devices or electronic components of a MEMS sensor system. The first SMD component 60 and the second SMD component 70 may be integrated passive devices (IPDs).

The second resin layer 9 is disposed on the front surface 1a of the circuit substrate 1. The second resin layer 9 covers the second semiconductor element 50, the first SMD component 60, and the second SMD component 70. The second resin layer 9 is composed of a low dielectric constant material having a relative dielectric constant of 4 or less. For example, the second resin layer 9 is composed of thermosetting epoxy resin.

The semiconductor device 100 illustrated in FIG. 1 and FIG. 2 is mounted, for example, on a substrate not illustrated. For example, the external connection terminals 5 of the semiconductor device 100 are joined to a wiring layer of the substrate not illustrated with the back surface 1b of the circuit substrate 1 facing the substrate not illustrated.

Figure 3:
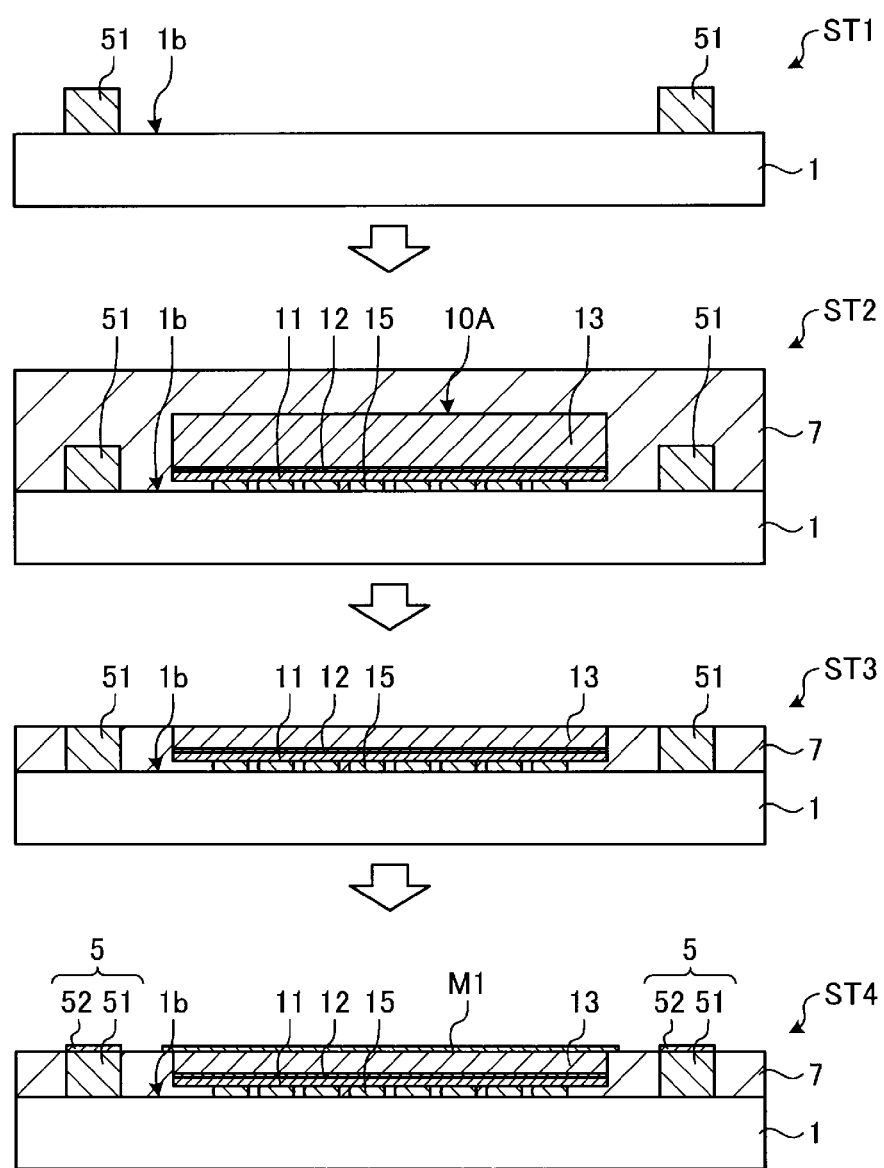
FIG. 3 is a sectional diagram illustrating a method for manufacturing the semiconductor device according to the first embodiment in order of processes.
Figure 4:
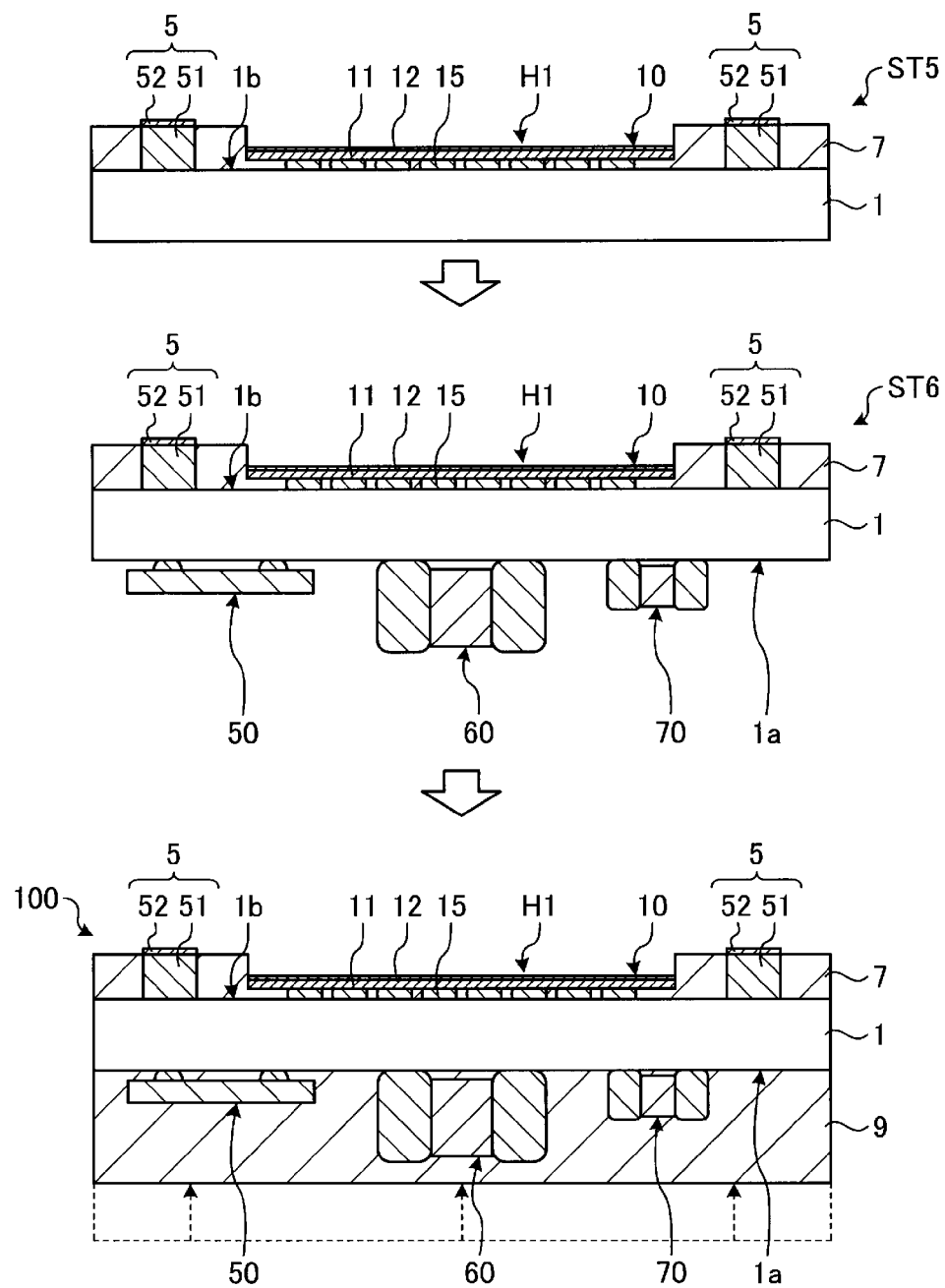
FIG. 4 is a sectional diagram illustrating the method for manufacturing the semiconductor device according to the first embodiment in order of processes.

A method for manufacturing the semiconductor device 100 illustrated in FIG. 1 and FIG. 2 will now be described. FIG. 3 and FIG. 4 are sectional diagrams illustrating the method for manufacturing the semiconductor device according to the first embodiment in order of processes. As illustrated in FIG. 3 and FIG. 4, the semiconductor device 100 according to the first embodiment is completed through a process at step ST1 to a process at step ST6. In FIG. 3, FIG. 4, FIG. 5 to FIG. 12 described later, an illustration of the wiring layer 3 of the circuit substrate 1 is omitted.

At step ST1 in FIG. 3, a manufacturing apparatus (not illustrated) forms the external connection terminals 5 on the back surface 1b of the circuit substrate 1. According to the present disclosure, a method of forming the external connection terminals 5 is not particularly limited. For example, the manufacturing apparatus forms the metal layers 51 in a manner in which a mask (not illustrated) is placed on the back surface 1b of the circuit substrate 1, and a conductive material such as copper (Cu) is formed in a region that is exposed from the mark by printing or by plating. After the metal layers 51 are formed, the manufacturing apparatus removes the mask from the back surface 1b of the circuit substrate 1.

Subsequently, the manufacturing apparatus mounts a first semiconductor element 10A on the back surface 1b of the circuit substrate 1 by surface mounting (step ST2). The first semiconductor element 10A includes the support substrate 13, the insulating layer 12, the semiconductor layer 11, and the bump electrode 15. The insulating layer 12 is disposed on a surface of the support substrate 13. The semiconductor layer 11 is disposed opposite the support substrate 13 with the insulating layer 12 interposed therebetween. The bump electrode 15 is disposed opposite the insulating layer 12 with the semiconductor layer 11 interposed therebetween. For example, the support substrate 13, the insulating layer 12, and the semiconductor layer 11 are included in the SOI (Silicon on Insulator) substrate. The support substrate 13 is a single-crystal Si substrate. The insulating layer 12 is a silicon oxide film. The semiconductor layer 11 is a very thin single-crystal silicon layer that is formed, for example, by bonding Si wafers each of which is covered by an oxide film and by using a Smart cut technique and a highly accurate grinding polishing technique.

Subsequently, the manufacturing apparatus forms the first resin layer 7 on the back surface 1b of the circuit substrate 1. For example, the manufacturing apparatus forms the first resin layer 7 by using a transfer molding technique. Consequently, the first semiconductor element 10A and the metal layers 51 are covered and sealed by the first resin layer 7. At this time, the first resin layer 7 is filled also between the first semiconductor element 10A and the circuit substrate 1.

Subsequently, the manufacturing apparatus grinds a surface of the first resin layer 7 and exposes the support substrate 13 and the metal layers 51 from the first resin layer 7 (step ST3). An example of the manufacturing apparatus that is used for grinding is a grinder that has a grindstone. The grinder rotates the grindstone relatively to the first resin layer 7 to grind the surface of the first resin layer 7. Grinding the first resin layer 7 is not limited to a method using the grinder. For example, the first resin layer 7 may be ground by CMP (Chemical Mechanical Polishing).

Subsequently, the manufacturing apparatus forms a mask M1 on the support substrate 13 (step ST4). An example of the mask M1 is a resin material. The surface of the support substrate 13 that is exposed from the first resin layer 7 is entirely covered by the mask M1. Subsequently, the manufacturing apparatus forms the plating layers 52 by plating metal on the metal layers 51. For example, the manufacturing apparatus plates Ni and Au in this order with the support substrate 13 covered by the mask M1 and with the metal layers 51 exposed from the mask M1. Consequently, the plating layers 52 are formed only on the metal layers 51, and the external connection terminals 5 that include the metal layers 51 and the plating layers 52 are completed. After the plating layers 52 are formed, the manufacturing apparatus removes the mask M1 from the support substrate 13.

Subsequently, the manufacturing apparatus removes the support substrate 13 by etching in a condition in which the support substrate 13 is more likely to be etched than the first resin layer 7 and the insulating layer 12 (step ST5). Consequently, the manufacturing apparatus forms the first semiconductor element 10 with the support substrate 13 removed from the first semiconductor element 10A and forms the recessed portion H1 above the first semiconductor element 10.

The support substrate 13 is preferably etched by wet etching to reduce damage of the insulating layer 12 that is a grounding. In this case, a chemical and a temperature are selected for etchant such that etching is selectively stopped at the insulating layer 12. An example of the etchant is a TMAH (tetramethylammonium hydroxide) aqueous solution. The TMAH aqueous solution having a concentration of 10 mass percent (wt %) and a temperature of 80° C. enables only the support substrate 13 composed of Si to be etched by using the insulating layer 12 composed of $SiO_2$ as an etching stopper. The first resin layer 7, the plating layers 52, and the metal layers 51 are neither etched nor corroded by the above TMAH aqueous solution.

Subsequently, the manufacturing apparatus mounts the second semiconductor element 50, the first SMD component 60, and the second SMD component 70 on the front surface 1a of the circuit substrate 1 (step ST6). Subsequently, the manufacturing apparatus forms the second resin layer 9 on the front surface 1a of the circuit substrate 1. For example, the manufacturing apparatus forms the second resin layer 9 by a transfer molding technique. Consequently, the second semiconductor element 50, the first SMD component 60, and the second SMD component 70 are covered and sealed by the second resin layer 9. Subsequently, as illustrated by a dotted line in FIG. 4, the manufacturing apparatus grinds a surface of the second resin layer 9 to adjust the final thickness of the semiconductor device 100. Through the above processes, the semiconductor device 100 is completed.

The semiconductor device 100 according to the first embodiment includes the circuit substrate 1, the first semiconductor element 10 that is disposed on the back surface 1b of the circuit substrate 1, and the first resin layer 7 that is disposed on the back surface 1b of the circuit substrate 1 and that surrounds the first semiconductor element 10 as described above. That is, as illustrated in FIG. 1, the first resin layer 7 is disposed around the first semiconductor element 10 above the circuit substrate 1 in a plan view. The circuit substrate 1 includes the wiring layer 3. The first semiconductor element 10 includes the semiconductor layer 11, the bump electrode 15 that is located on the surface of the semiconductor layer 11 facing the circuit substrate 1, and the insulating layer 12 that is located opposite the bump electrode 15 with the semiconductor layer 11 interposed therebetween. The bump electrode 15 is connected to the wiring layer 3. The height T7 of the first resin layer 7 from the back surface 1b is more than the height T10 of the first semiconductor element 10 from the back surface 1b.

In this case, there is the recessed portion H1 that is surrounded by the resin dam above the first semiconductor element 10. Inside the recessed portion H1, an air layer can be located. This enables the semiconductor device 100 to reduce the stray capacitance of the semiconductor layer 11 and improves the radio frequency characteristics of the first semiconductor element 10. Heat that is generated by the first semiconductor element 10 is dissipated to the air layer via the insulating layer 12. Accordingly, the semiconductor device 100 can improve the heat dissipation of the first semiconductor element 10.

A technique that is compared with the present embodiment will now be described. A semiconductor device that is used at a radio frequency typically includes an active layer in which a transistor is formed and a support substrate that supports the active layer. The resistivity and the dielectric constant of the support substrate affect the radio frequency characteristics of the semiconductor device. For example, the resistivity and the dielectric constant of the support substrate prevent the radio frequency characteristics of the semiconductor device from being improved and cause the degradation of the radio frequency characteristics. In methods that can be thought to reduce such an effect, an SOI substrate that includes a low dielectric constant insulating layer ($SiO_2$) that is inserted between the active layer and the support substrate is used, or a substrate having a high resistance of 1 kΩ·cm is used as the support substrate. However, the substrates that are used in these methods are expensive. In other methods that can be thought, the thickness of the insulating layer of the SOI substrate is increased, the resistance of the support substrate is increased to 10 kΩ·cm, or a trap-rich layer is inserted along the interface between the insulating layer and the support substrate. However, these methods are difficult to perform, and the number of processes increases, that is, the methods are expensive techniques.

However, the semiconductor device 100 according to the present embodiment can be manufactured by a typical mass production technique for a semiconductor device such as surface mounting (flip chip mounting), resin sealing, grinding, and etching. Accordingly, the semiconductor device 100 enables the radio frequency characteristics to be improved at low cost.

As for the semiconductor device according to the present embodiment, probe inspection and visual inspection of the elements and the components can be carried out before the first semiconductor element 10A, the second semiconductor element 50, the first SMD component 60, and the second SMD component 70 are mounted on the circuit substrate 1. Consequently, the first semiconductor element 10A, the second semiconductor element 50, the first SMD component 60, and the second SMD component 70 that are determined to be good products in the probe inspection and the visual inspection can be selectively mounted on the circuit substrate 1. This enables the yield of the semiconductor device 100 to be increased and can be conducive to reduction in the costs of the semiconductor device 100.

The first semiconductor element 10 is surrounded by the resin dam with the height of the resin dam from the back surface 1b being more than that of the first semiconductor element 10. Consequently, the resin dam can protect the first semiconductor element 10 from contact with or collision to an external substrate or an external device, and the first semiconductor element 10 can be prevented from being damaged. For example, the resin dam prevents the first semiconductor element 10 from being scratched, a microcrack or a chip breakage of the first semiconductor element 10 due to a scratch can be inhibited from occurring.

In the first semiconductor element 10, the semiconductor layer 11 is covered by the insulating layer 12. Consequently, the insulating layer 12 can prevent metal (for example, Cu or Fe) that is likely to diffuse in a silicon material from coming into contact with the semiconductor layer 11. Accordingly, the first semiconductor element 10 can prevent the radio frequency characteristics from varying due to contact with the above metal.

The resin dam is in close contact with the side surfaces 10s of the first semiconductor element 10. This enables the resin dam to surround the first semiconductor element 10 with no gap. Consequently, the resin dam can support the first semiconductor element 10 sideways, and strength (referred to below as element strength) with which the first semiconductor element 10 is mounted on the circuit substrate 1 can be increased. The resin dam is in close contact with the side surfaces 10s of the first semiconductor element 10 and prevents a substance such as a liquid from entering the inside (for example, the semiconductor layer 11) of the first semiconductor element 10 from the outside.

The first resin layer 7 is filled between the first semiconductor element 10 and the circuit substrate 1. This enables the first resin layer 7 to increase the degree of close contact between the first semiconductor element 10 and the circuit substrate 1 and to further increase the element strength.

The relative dielectric constant of the first resin layer 7 is 4 or less. This enables the semiconductor device 100 to reduce the stray capacitance between the first semiconductor element 10 and the first resin layer 7 to a low level.

The first resin layer 7 is composed of thermosetting resin. In this case, the material of the first resin layer 7 can be a fluid such as a liquid when being filled and can be cured by subsequent heat treatment. For example, thermosetting epoxy resin can be used for the first resin layer 7. The manufacturing apparatus can form the first resin layer 7 by using a transfer molding technique, readily brings the first resin layer 7 into close contact with the side surfaces of the first semiconductor element 10 and readily fills the first resin layer 7 between the first semiconductor element 10 and the circuit substrate 1.

The semiconductor device 100 also includes the external connection terminals 5 that are disposed on the back surface 1b of the circuit substrate 1. The height T5 of each external connection terminal 5 from the back surface 1b is equal to the height T7 of the resin dam from the back surface 1b or more than the height T7. This enables the semiconductor device 100 to be mounted on an external substrate by surface mounting with a portion near the back surface 1b of the circuit substrate 1 facing the external substrate.

The semiconductor device 100 also includes the second semiconductor element 50, the first SMD component 60, and the second SMD component 70 that are disposed on the front surface 1a of the circuit substrate 1, and the second resin layer 9 that covers the second semiconductor element 50, the first SMD component 60, and the second SMD component 70 that are disposed on the front surface 1a of the circuit substrate 1. In this case, a region of the front surface 1a of the circuit substrate 1 is used as a region for mounting the elements. Accordingly, the semiconductor device 100 can increase the mounting density of the elements on the circuit substrate 1.

The first semiconductor element 10A used in the method for manufacturing the semiconductor device according to the first embodiment includes the support substrate 13, the insulating layer 12 that is disposed on the surface of the support substrate 13, the semiconductor layer 11 that is disposed opposite the support substrate 13 with the insulating layer 12 interposed therebetween, and the bump electrode 15 that is disposed opposite the insulating layer 12 with the semiconductor layer 11 interposed therebetween. The method for manufacturing the semiconductor device according to the first embodiment includes a step of connecting the bump electrode 15 to the wiring layer 3 of the circuit substrate 1 such that the semiconductor layer 11 faces the back surface 1b of the circuit substrate 1, a step of forming the first resin layer 7 on the back surface 1b of the circuit substrate 1 and covering the first semiconductor element 10A, and a step of grinding the first resin layer 7 and exposing the support substrate 13, and a step of etching and removing the support substrate 13 that is exposed from the first resin layer 7.

In this way, the manufacturing apparatus can form the first semiconductor element 10 from the first semiconductor element 10A. The manufacturing apparatus can also form the recessed portion H1 above the first semiconductor element 10 and can form the first resin layer 7 into a dam shape that surrounds the first semiconductor element 10 and the recessed portion H1.

The area of the support substrate 13 to be etched is determined in a self-matching manner in which the manufacturing apparatus grinds the first resin layer 7 and exposes the surface of the support substrate 13. It is not necessary to place the mask around the support substrate 13 to determine the area to be etched. For this reason, there is no misalignment of a mask with respect to the area to be etched. Accordingly, the manufacturing apparatus can form the recessed portion H1 through reduced processes with high accuracy of position with respect to the first semiconductor element 10. When the recessed portion H1 is formed, the insulating layer 12 below the support substrate 13 functions as the etching stopper. Accordingly, the depth of the recessed portion H1 is automatically determined by the thickness of the support substrate 13 before etching. The depth of the recessed portion H1 is easy to control.

The resistivity of the support substrate 13 is less than 1 kΩ·cm. The support substrate 13 may be a Si substrate having a resistivity of less than 1 kΩ·cm. This enables the manufacturing apparatus to manufacture the semiconductor device 100 by using a relatively low-cost SOI substrate that is generally used. This can be conducive to reduction in the manufacturing costs of the semiconductor device 100.

(First Modification)

In the above description according the first embodiment, the second semiconductor element 50, the first SMD component 60, and the second SMD component 70 are mounted on the front surface 1a of the circuit substrate 1 after the recessed portion H1 is formed. According to the present embodiment, however, the order of the processes for manufacturing the semiconductor device 100 is not limited to the above description. For example, the recessed portion H1 may be formed after the second semiconductor element 50, the first SMD component 60, and the second SMD component 70 are mounted.

Figure 5:
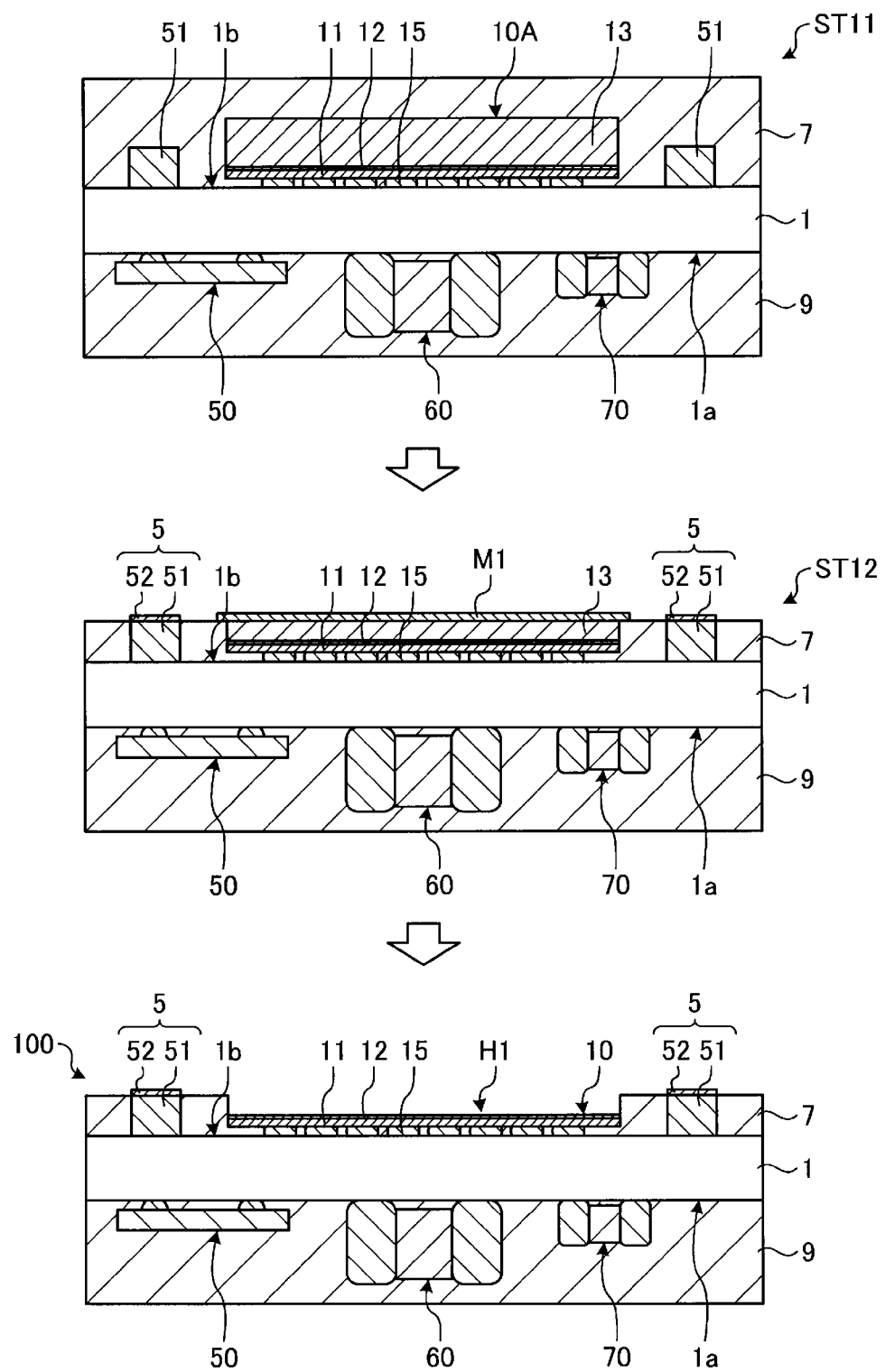
FIG. 5 is a sectional diagram illustrating a method for manufacturing a semiconductor device according to a first modification to the first embodiment in order of processes.

FIG. 5 is a sectional diagram illustrating a method for manufacturing a semiconductor device according to a first modification to the first embodiment in order of processes. At step ST11 in FIG. 5, the manufacturing apparatus forms the metal layers 51 on the back surface 1b of the circuit substrate 1. Subsequently, the manufacturing apparatus mounts the first semiconductor element 10A on the back surface 1b of the circuit substrate 1. Subsequently, the manufacturing apparatus forms the first resin layer 7 on the back surface 1b of the circuit substrate 1. Subsequently, the manufacturing apparatus mounts the second semiconductor element 50, the first SMD component 60, and the second SMD component 70 on the front surface 1a of the circuit substrate 1. Subsequently, the manufacturing apparatus forms the second resin layer 9 on the front surface 1a of the circuit substrate 1.

Subsequently, the manufacturing apparatus grinds the surface of the first resin layer 7 and exposes the support substrate 13 and the metal layers 51 from the first resin layer 7 (step ST12). Subsequently, the manufacturing apparatus forms the mask M1 on the support substrate 13. Subsequently, the manufacturing apparatus forms the plating layers 52 by plating metal on the metal layers 51. After the plating layers 52 are formed, the manufacturing apparatus removes the mask M1 from the support substrate 13.

Subsequently, the manufacturing apparatus removes the support substrate 13 by etching in a condition in which the support substrate 13 is more likely to be etched than the first resin layer 7 and the insulating layer 12. Consequently, the manufacturing apparatus forms the first semiconductor element 10 with the support substrate 13 removed from the first semiconductor element 10A and forms the recessed portion H1 above the first semiconductor element 10. Subsequently, the manufacturing apparatus grinds the surface of the second resin layer 9 to adjust the final thickness of the semiconductor device 100.

Also in this way, the manufacturing apparatus can form the semiconductor device 100 according to the first embodiment. In the process of mounting the second semiconductor element 50, the first SMD component 60, and the second SMD component 70 and the process of forming the second resin layer 9, the insulating layer 12 is covered by the support substrate 13. Accordingly, the manufacturing method according to the first modification enables the insulating layer 12 to be protected from being damaged in the process of mounting the first SMD component 60 and the second SMD component 70 and the process of forming the second resin layer 9.

(Second Modification)

In the above description according to the first embodiment, the external connection terminals 5 are disposed on the back surface 1b of the circuit substrate 1. According to the present embodiment, however, the external connection terminals 5 may not be located on the back surface 1b of the circuit substrate 1.

Figure 6:
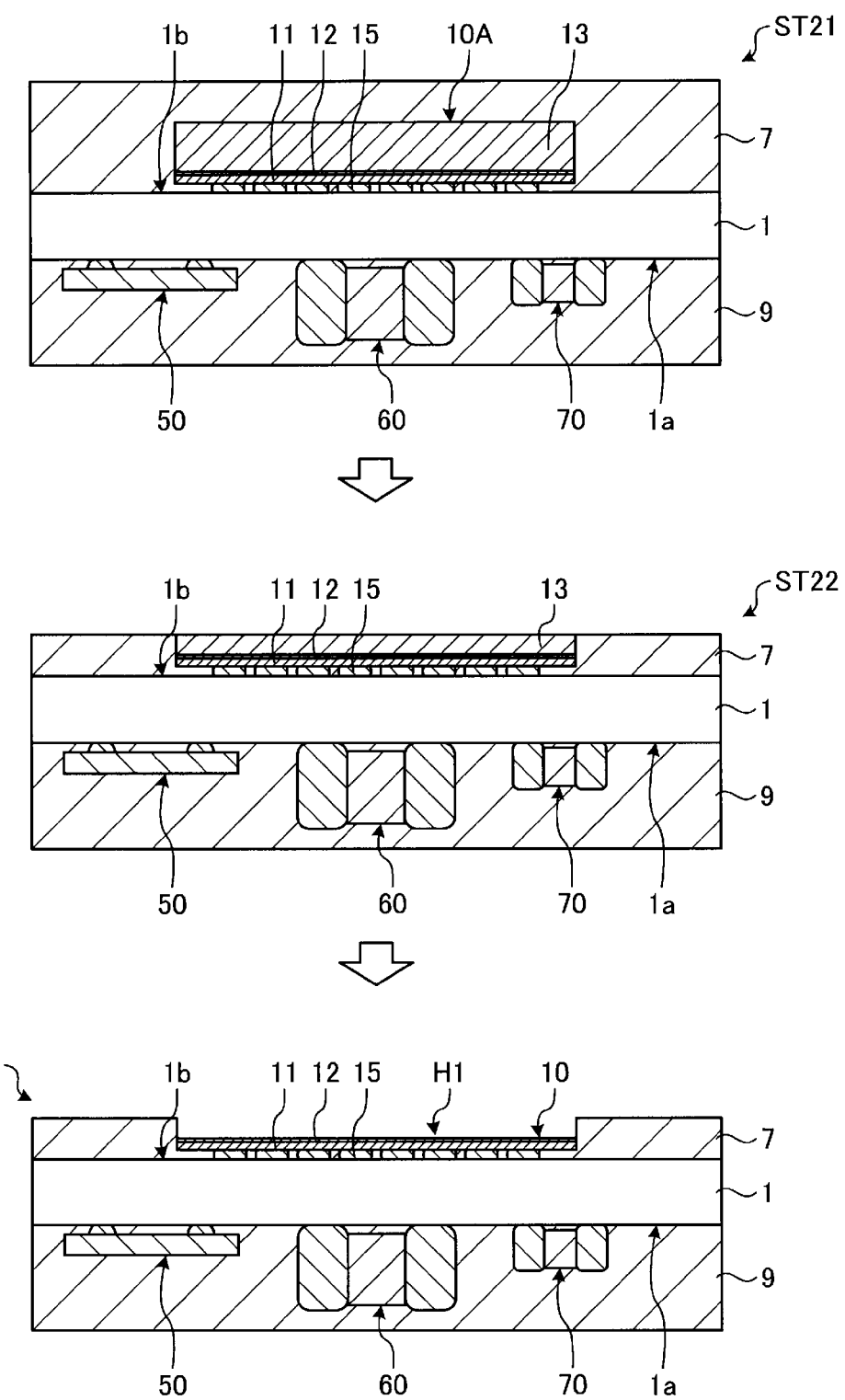
FIG. 6 is a sectional diagram illustrating a semiconductor device according to a second modification to the first embodiment and a method for manufacturing the semiconductor device.

FIG. 6 is a sectional diagram illustrating a semiconductor device according to a second modification to the first embodiment and a method for manufacturing the semiconductor device. In a semiconductor device 100A according to the second modification to the first embodiment, as illustrated in FIG. 6, the external connection terminals 5 are not disposed on the back surface 1b of the circuit substrate 1. The method for manufacturing the semiconductor device 100A is the same as the method for manufacturing the semiconductor device 100 illustrated in FIG. 5 except for the process of forming the external connection terminals 5.

Specifically, at step ST21 in FIG. 6, the manufacturing apparatus mounts the first semiconductor element 10A on the back surface 1b of the circuit substrate 1. Subsequently, the manufacturing apparatus forms the first resin layer 7 on the back surface 1b of the circuit substrate 1. Subsequently, the manufacturing apparatus mounts the second semiconductor element 50, the first SMD component 60, and the second SMD component 70 on the front surface 1a of the circuit substrate 1. Subsequently, the manufacturing apparatus forms the second resin layer 9 on the front surface 1a of the circuit substrate 1.

Subsequently, the manufacturing apparatus grinds the surface of the first resin layer 7 and exposes the support substrate 13 from the first resin layer 7 (step ST22). Subsequently, the manufacturing apparatus removes the support substrate 13 by etching in a condition in which the support substrate 13 is more likely to be etched than the first resin layer 7 and the insulating layer 12. Consequently, the manufacturing apparatus forms the first semiconductor element 10 with the support substrate 13 removed from the first semiconductor element 10A and forms the recessed portion H1 above the first semiconductor element 10. Subsequently, the manufacturing apparatus grinds the surface of the second resin layer 9 to adjust the final thickness of the semiconductor device 100A. Through the above processes, the semiconductor device 100A is completed.

As in the semiconductor device 100 described above, the semiconductor device 100A has the recessed portion H1 above the first semiconductor element 10. Consequently, the semiconductor device 100A can improve the radio frequency characteristics of the first semiconductor element 10. Also in the semiconductor device 100A, the first semiconductor element 10 is surrounded by the resin dam. Consequently, the resin dam can protect the first semiconductor element 10 from contact with or collision to an external substrate or an external device, and the first semiconductor element 10 can be prevented from being damaged.

According to the present embodiment, an external connection terminal may be disposed on at least a surface among the front surface 1a of the circuit substrate 1 and the side surfaces of the circuit substrate 1, although this is not illustrated.

(Third Modification)

According to the first embodiment, a SMD component or a semiconductor element may be disposed on the back surface 1b of the circuit substrate 1. The SMD component or the semiconductor element may be covered by the resin dam. That is, the SMD component or the semiconductor element may be contained in the resin dam.

Figure 7:
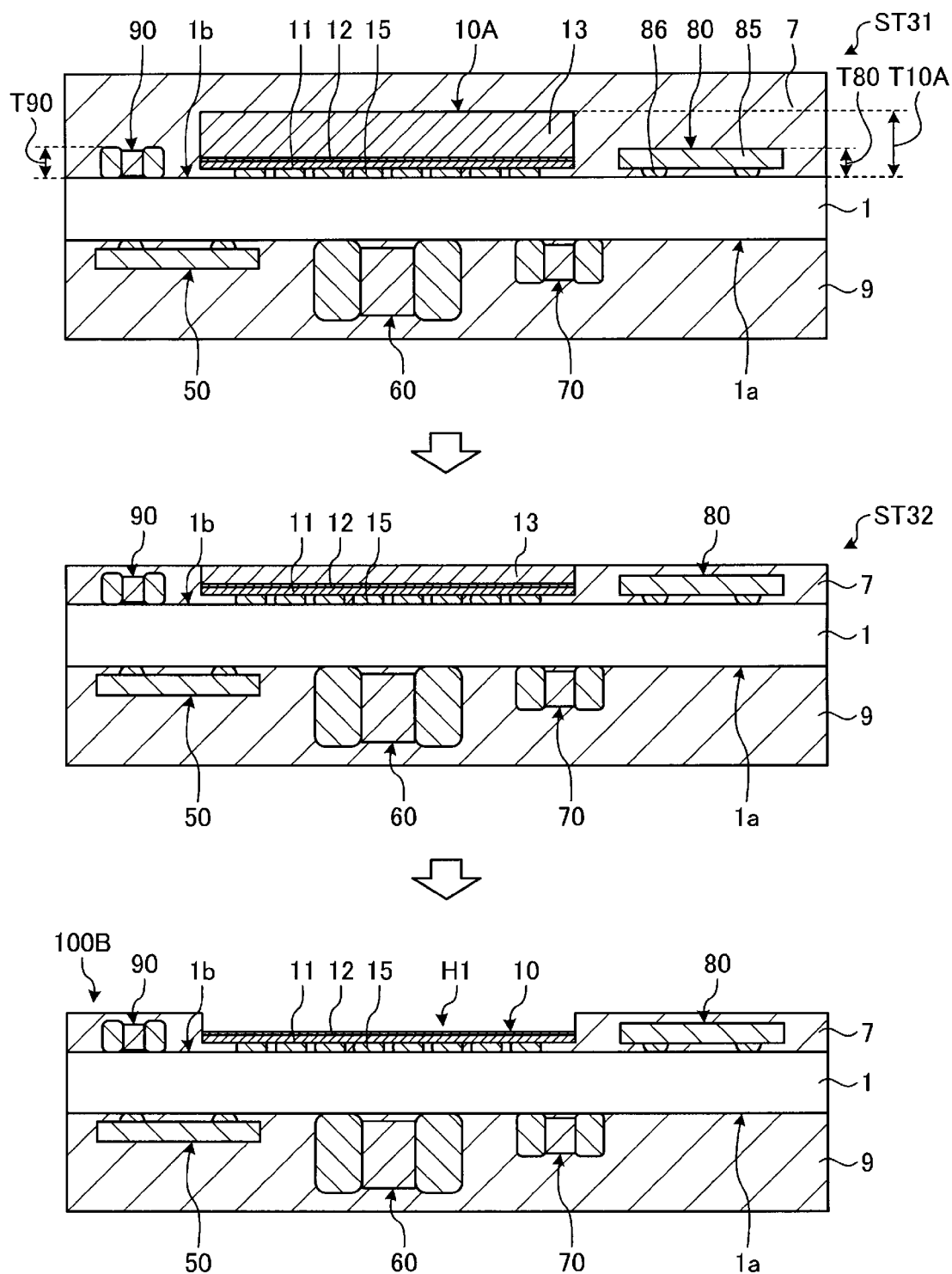
FIG. 7 is a sectional diagram illustrating a semiconductor device according to a third modification to the first embodiment and a method for manufacturing the semiconductor device.

FIG. 7 is a sectional diagram illustrating a semiconductor device 100B according to a third modification to the first embodiment and a method for manufacturing the semiconductor device. In the semiconductor device 100B according to the third modification to the first embodiment, as illustrated in FIG. 7, a third semiconductor element 80 is mounted on the back surface 1b of the circuit substrate 1 by surface mounting. The third semiconductor element 80 includes a semiconductor substrate 85 and a bump electrode 86 as in the second semiconductor element 50. According to the present disclosure, the third semiconductor element 80 is also referred to as a third element in some cases. An example of the semiconductor substrate 85 is a single-crystal Si substrate and includes an integrated circuit. The bump electrode 86 is located between the semiconductor substrate 85 and the circuit substrate 1 and is connected to the second wiring layer 3b (see FIG. 2) of the circuit substrate 1.

In the semiconductor device 100B, a third SMD component 90 is mounted on the back surface 1b of the circuit substrate 1. The third SMD component 90 is an electronic component, and the kind thereof is not particularly limited. According to the present disclosure, the third SMD component 90 is also referred to as the third element in some cases. For example, the third SMD component 90 is a discrete semiconductor, a capacitor element or a resistance element. The third SMD component 90 is not limited to a Si semiconductor device. The third SMD component 90 may be a compound semiconductor device or an electronic component of a MEMS sensor system. The third SMD component 90 may be an integrated passive device (IPD).

In the semiconductor device 100B, the height T10 (see FIG. 2) of the first semiconductor element 10 is less than the height T80 of the third semiconductor element 80 and is less than the height T90 of the third SMD component 90. That is, the first semiconductor element 10 is a thin-layer semiconductor element having a thickness less than those of the third semiconductor element 80 and the third SMD component 90.

The method for manufacturing the semiconductor device 100B is the same as the method for manufacturing the semiconductor device 100A illustrated in FIG. 6 except for the process of mounting the third semiconductor element 80 and the third SMD component 90. Specifically, at step ST31 in FIG. 7, the manufacturing apparatus mounts the first semiconductor element 10A, the third semiconductor element 80, and the third SMD component 90 on the back surface 1b of the circuit substrate 1.

The height of the first semiconductor element 10A from the back surface 1b is designated by T10A. The height of the third semiconductor element 80 from the back surface 1b is designated by T80. The height of the third SMD component 90 from the back surface 1b is designated by T90. The height T10A of the first semiconductor element 10A from the back surface 1b is more than the height T80 of the third semiconductor element 80 from the back surface 1b. The height T10A of the first semiconductor element 10A from the back surface 1b is more than the height T90 of the third SMD component 90 from the back surface 1b. That is, according to the present embodiment, relationships among the magnitudes of the heights T10A, T80, and T90 satisfy T10A>T80 and T10A>T90. The heights T80 and T90 may be equal to each other or may differ from each other.

Subsequently, the manufacturing apparatus forms the first resin layer 7 on the back surface 1b of the circuit substrate 1. Consequently, the first semiconductor element 10A, the third semiconductor element 80, and the third SMD component 90 are covered by the first resin layer 7. Subsequently, the manufacturing apparatus mounts the second semiconductor element 50, the first SMD component 60, and the second SMD component 70 on the front surface 1a of the circuit substrate 1. Subsequently, the manufacturing apparatus forms the second resin layer 9 on the front surface 1a of the circuit substrate 1.

Subsequently, the manufacturing apparatus grinds the surface of the first resin layer 7 and exposes only the support substrate 13 from the first resin layer 7 (step ST32). The manufacturing apparatus can stop grinding in a state where the support substrate 13 is exposed and the third semiconductor element 80 and the third SMD component 90 are not exposed because T10A>T80 and T10A>T90 hold as described above.

Subsequently, the manufacturing apparatus removes the support substrate 13 by etching in a condition in which the support substrate 13 is more likely to be etched than the first resin layer 7 and the insulating layer 12. The TMAH aqueous solution is used as the etchant as described above. Consequently, the manufacturing apparatus forms the first semiconductor element 10 with the support substrate 13 removed from the first semiconductor element 10A and forms the recessed portion H1 above the first semiconductor element 10. The third semiconductor element 80 and the third SMD component 90 are covered by the first resin layer 7, and the third semiconductor element 80 and the third SMD component 90 are not etched. Subsequently, the manufacturing apparatus grinds the surface of the second resin layer 9 to adjust the final thickness of the semiconductor device 100B. Through the above processes, the semiconductor device 100B is completed.

As in the semiconductor device 100 described above, the semiconductor device 100B has the recessed portion H1 above the first semiconductor element 10. Consequently, the semiconductor device 100B can improve the radio frequency characteristics of the first semiconductor element 10. The semiconductor device 100B includes the resin dam that surrounds the first semiconductor element 10. The resin dam can protect the first semiconductor element 10 from contact with or collision to an external substrate or an external device, and the first semiconductor element 10 can be prevented from being damaged.

The semiconductor device 100B includes the third semiconductor element 80 and the third SMD component 90 that are disposed on the back surface 1b of the circuit substrate 1. This enables the semiconductor device 100B to increase the mounting density of the elements on the back surface 1b of the circuit substrate 1. The third semiconductor element 80 and the third SMD component 90 are covered by the resin dam. That is, the third semiconductor element 80 and the third SMD component 90 are contained in the resin dam. Consequently, the resin dam can protect the third semiconductor element 80 and the third SMD component 90 from contact with or collision to an external substrate or an external device, and the third semiconductor element 80 and the third SMD component 90 can be prevented from being damaged.

According to the method for manufacturing the semiconductor device 100B, the height T10A of the first semiconductor element 10A is more than the height T80 of the third semiconductor element 80 and is more than the height T90 of the third SMD component 90 (T10A>T80 and T10A>T90). That is, the thickness of the first semiconductor element 10A is more than the thicknesses of the third semiconductor element 80 and the third SMD component 90. In the process of grinding the first resin layer 7, the support substrate 13 of the first semiconductor element 10A is exposed before the third semiconductor element 80 and the third SMD component 90 are exposed. The support substrate 13 is etched and removed with the third semiconductor element 80 and the third SMD component 90 covered by the first resin layer 7.

Consequently, the manufacturing apparatus can include the first semiconductor element (thin-layer semiconductor element) 10 and the third semiconductor element 80 and the third SMD component 90 that are thinner than the first semiconductor element 10 together on the back surface 1b of the circuit substrate 1.

(Fourth Modification)

Figure 8:
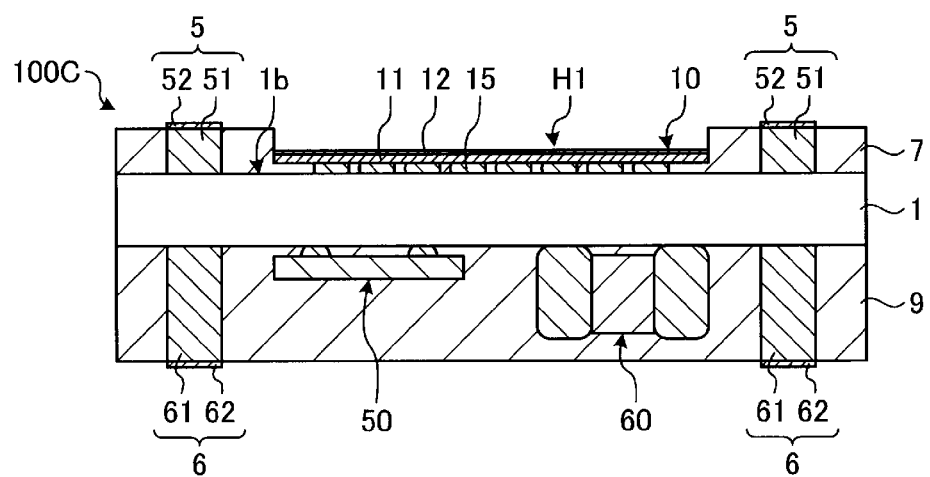
FIG. 8 is a sectional diagram illustrating a semiconductor device according to a fourth modification to the first embodiment.

FIG. 8 is a sectional diagram illustrating a semiconductor device according to a fourth modification to the first embodiment. As illustrated in FIG. 8, a semiconductor device 100C according to the fourth modification to the first embodiment includes the external connection terminals (referred to below as first external connection terminals) 5 that are disposed on the back surface 1b of the circuit substrate 1 and second external connection terminals 6 that are disposed on the front surface 1a of the circuit substrate 1. Each second external connection terminal 6 includes a metal layer 61 and a plating layer 62 that covers the metal layer 61. The plating layer 62 protrudes from the surface (lower surface in FIG. 8) of the second resin layer 9.

The second external connection terminals 6 can be formed by the same method as the first external connection terminals 5. For example, the manufacturing apparatus performs a process of forming the metal layers 61 on the front surface 1a of the circuit substrate 1, a process of mounting the first SMD component 60 and the second SMD component 70 on the front surface 1a of the circuit substrate 1, a process of forming the second resin layer 9 on the front surface 1a of the circuit substrate 1 and covering the metal layers 61, the first SMD component 60, and the second SMD component

70, a process of grinding the surface of the second resin layer 9 and exposing only the metal layers 61, and a process of forming the plating layers 62 by plating metal on the metal layers 61 in this order. Consequently, the manufacturing apparatus can form the second external connection terminals 6.

As in the semiconductor device 100 described above, the semiconductor device 100C has the recessed portion H1 above the first semiconductor element 10. Consequently, the semiconductor device 100C can improve the radio frequency characteristics of the first semiconductor element 10. The semiconductor device 100C includes the resin dam that surrounds the first semiconductor element 10. The resin dam can protect the first semiconductor element 10 from contact with or collision to an external substrate or an external device, and the first semiconductor element 10 can be prevented from being damaged.

The semiconductor device 100C can be connected to an external first substrate, not illustrated, by using the first external connection terminals 5. The semiconductor device 100C can be connected to an external second substrate, not illustrated, by using the second external connection terminals 6. Accordingly, the semiconductor device 100C can be interposed between the external first substrate and the second substrate.

(Fifth Modification)

Figure 9:
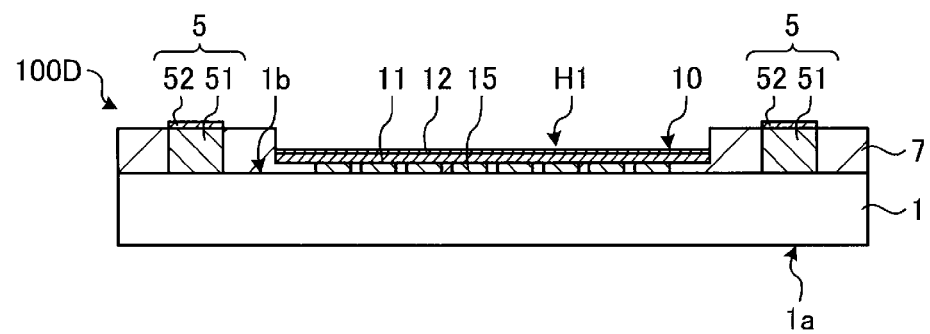
FIG. 9 is a sectional diagram illustrating a semiconductor device according to a fifth modification to the first embodiment.

FIG. 9 is a sectional diagram illustrating a semiconductor device according to a fifth modification to the first embodiment. In a semiconductor device 100D according to the fifth modification to the first embodiment, as illustrated in FIG. 9, the external connection terminals 5, the first semiconductor element 10, and the first resin layer 7 are disposed on the back surface 1b of the circuit substrate 1. Neither a semiconductor element nor an electronic component is mounted on the front surface 1a of the circuit substrate 1, and a resin layer that covers these is not disposed.

As in the semiconductor device 100 described above, the semiconductor device 100D has the recessed portion H1 above the first semiconductor element 10. Consequently, the semiconductor device 100D can improve the radio frequency characteristics of the first semiconductor element 10. The semiconductor device 100D includes the resin dam that surrounds the first semiconductor element 10. The resin dam can protect the first semiconductor element 10 from contact with or collision to an external substrate or an external device, and the first semiconductor element 10 can be prevented from being damaged.

Second Embodiment

In the above description according to the first embodiment, the recessed portion H1 is formed in the first resin layer 7. According to the present embodiment, a third resin layer may be disposed in the recessed portion H1.

Figure 10:
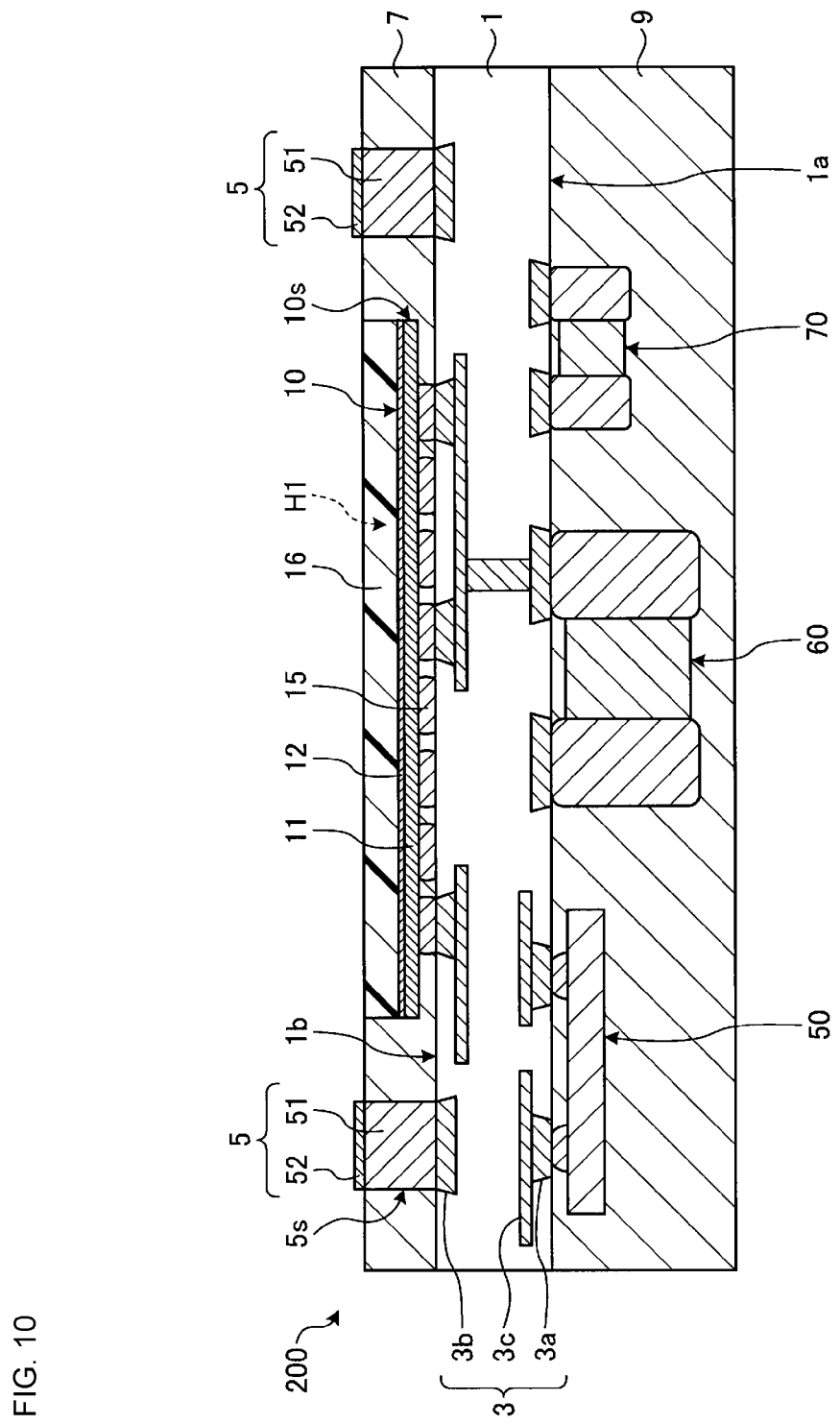
FIG. 10 is a sectional diagram illustrating an example of the structure of a semiconductor device according to a second embodiment.

FIG. 10 is a sectional diagram illustrating an example of the structure of a semiconductor device according to a second embodiment. As illustrated in FIG. 10, a semiconductor device 200 according to the second embodiment includes the circuit substrate 1, the external connection terminals 5, the first resin layer 7, the second resin layer 9, the first semiconductor element 10, the second semiconductor element 50, the first SMD (Surface Mount Device) component 60, the second SMD component 70, and a third resin layer 16.

The relative dielectric constant of the third resin layer 16 is preferably lower than the relative dielectric constant of Si. The relative dielectric constant of Si is, for example, 11.9. The resistivity of the third resin layer 16 is preferably higher than the resistivity of Si. The resistivity of Si is, for example, 1 kΩ·cm. Thermal conductivity of the third resin layer 16 is preferably higher than the thermal conductivity of $SiO_2$. Thermal conductivity of $SiO_2$ is, for example, 156 W/(m·K). Examples of the third resin layer 16 that fulfills at least one or more conditions among these three conditions include a BCB (benzocyclobutene) resin, a PI (polyimide) resin, or a resin containing powder such as AlN, SiC, or diamond.

The third resin layer 16 and the first resin layer 7 are flush with each other. That is, there is no step between the third resin layer and the first resin layer.

Figure 11:
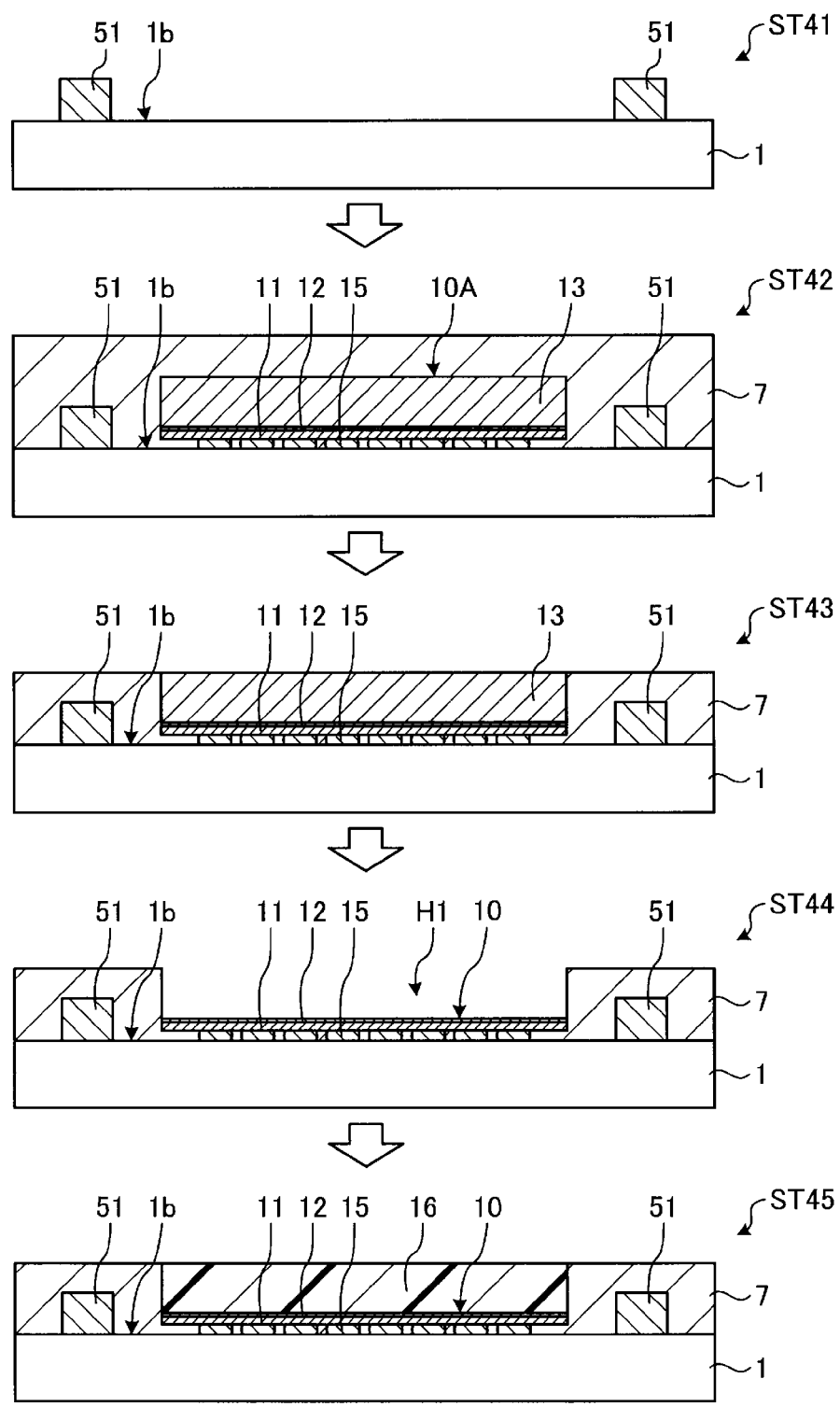
FIG. 11 is a sectional diagram illustrating a method for manufacturing the semiconductor device according to the second embodiment in order of processes.
Figure 12:
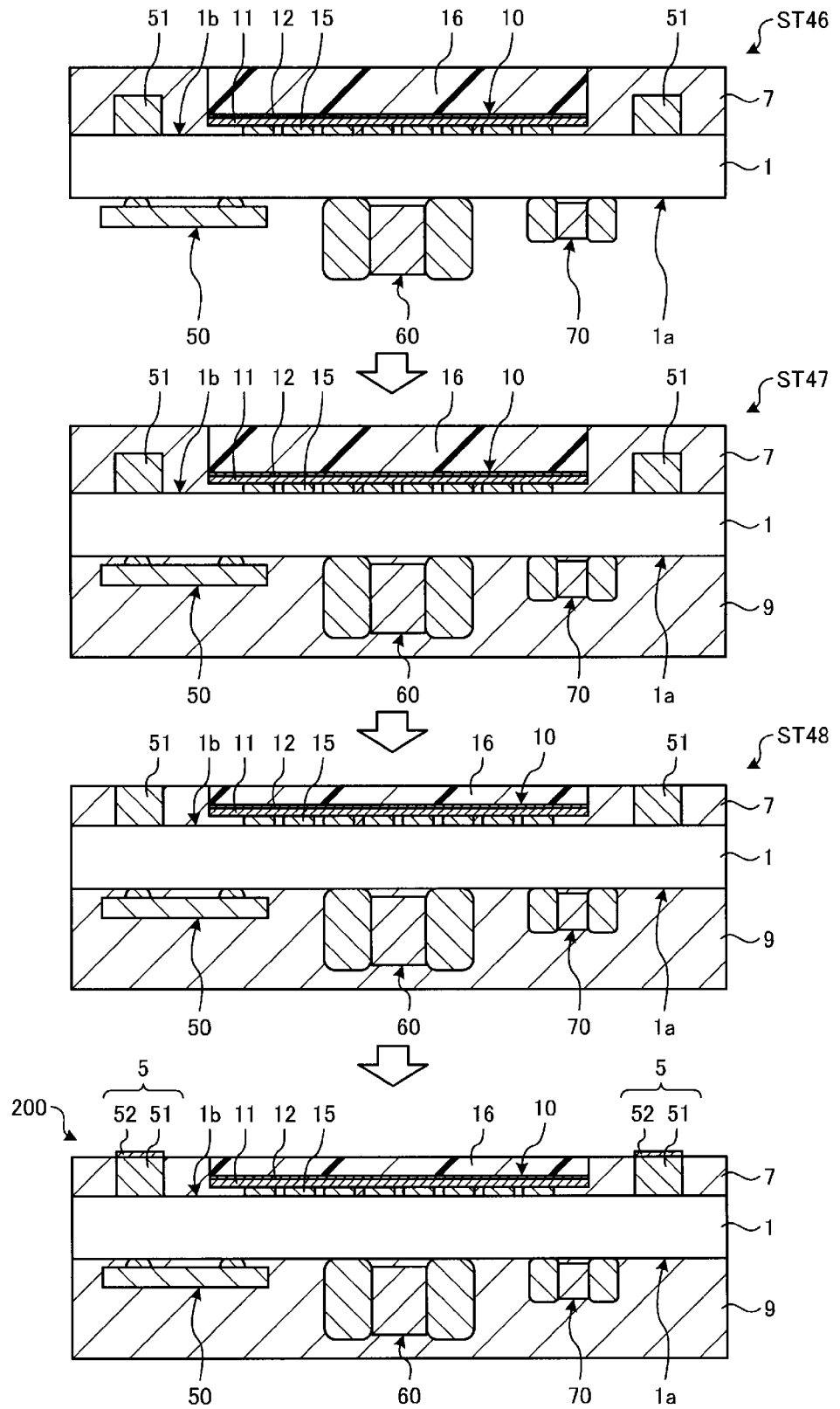
FIG. 12 is a sectional diagram illustrating the method for manufacturing the semiconductor device according to the second embodiment in order of processes.

A method for manufacturing the semiconductor device 200 illustrated in FIG. 10 will now be described. FIG. 11 and FIG. 12 are sectional diagrams illustrating the method for manufacturing the semiconductor device according to the second embodiment in order of processes. As illustrated in FIG. 11 and FIG. 12, the semiconductor device 200 according to the second embodiment is completed through a process at step ST41 to a process at step ST48. In FIG. 11 and FIG. 12, an illustration of the wiring layer 3 of the circuit substrate 1 is omitted.

At step ST41 in FIG. 11, the manufacturing apparatus (not illustrated) forms the external connection terminals 5 on the back surface 1b of the circuit substrate 1. Subsequently, the manufacturing apparatus mounts the first semiconductor element 10A on the back surface 1b of the circuit substrate 1 by surface mounting (step ST42). Subsequently, the manufacturing apparatus forms the first resin layer 7 on the back surface 1b of the circuit substrate 1. Consequently, the first semiconductor element 10A and the metal layers 51 are covered and sealed by the first resin layer 7.

Subsequently, the manufacturing apparatus grinds the surface of the first resin layer 7 and exposes the support substrate 13 from the first resin layer 7 (step ST43). Subsequently, the manufacturing apparatus removes the support substrate 13 by etching in a condition in which the support substrate 13 is more likely to be etched than the first resin layer 7 and the insulating layer 12 (step ST44). Consequently, the manufacturing apparatus forms the first semiconductor element 10 with the support substrate 13 removed from the first semiconductor element 10A and forms the recessed portion H1 above the first semiconductor element 10.

According to the second embodiment, the support substrate 13 is preferably etched by wet etching to reduce damage of the insulating layer 12 that is a grounding as in the first embodiment. For example, the manufacturing apparatus uses a TMAH aqueous solution having a concentration of 10 mass percent (wt %) and a temperature of 80° C. as the etchant. Consequently, the manufacturing apparatus enables only the support substrate 13 composed of Si to be etched by using the insulating layer 12 composed of $SiO_2$ as an etching stopper.

Subsequently, the manufacturing apparatus fills the material of the third resin layer 16 in the recessed portion H1 (step ST45). The material of the third resin layer 16 is preferably a fluid such as a liquid when being filled and is preferably cured by subsequent heat treatment or UV treatment. This makes it easy to place the third resin layer 16 in the recessed portion H1 with no gap. The manufacturing apparatus can use a method such as screen printing, a syringe, rotation application, or spray application as a method of filling the material of the third resin layer 16. For example, the screen printing enables the material of the third resin layer 16 to be placed only in the recessed portion H1. Accordingly a waste of the material is reduced, and high material efficiency can be maintained unlike, for example, the rotation application. Examples of the material of the third resin layer 16 include a solvent containing BCB, a solvent containing PI, and resin paste containing powder such as AlN, SiC, or diamond.

Subsequently, the manufacturing apparatus performs heat treatment or UV treatment on the material of the third resin layer 16 in the recessed portion H1 to cure the material. In this way, the manufacturing apparatus forms the third resin layer 16 in the recessed portion H1. According to the present embodiment, the third resin layer 16 may have a sheet shape. In this case, the manufacturing apparatus may place a sheet material in the recessed portion H1 by using a lamination method.

Subsequently, the manufacturing apparatus mounts the second semiconductor element 50, the first SMD component 60, and the second SMD component 70 on the front surface 1a of the circuit substrate 1 (step ST46). Subsequently, the manufacturing apparatus forms the second resin layer 9 on the front surface 1a of the circuit substrate 1 (step ST47). Consequently, the second semiconductor element 50, the first SMD component 60, and the second SMD component 70 are covered and sealed by the second resin layer 9.

Subsequently, the manufacturing apparatus grinds the surfaces of the first resin layer 7 and the third resin layer 16 and exposes the metal layers 51 from the first resin layer 7 (step ST48). An example of the manufacturing apparatus that is used for grinding is a grinder that has a grindstone. The grinder rotates the grindstone relatively to the first resin layer 7 and the third resin layer 16 to grind the surfaces of the first resin layer 7 and the third resin layer 16. Grinding the first resin layer 7 and the third resin layer 16 is not limited to a method using the grinder. For example, the first resin layer 7 and the third resin layer 16 may be ground by CMP.

Subsequently, the manufacturing apparatus forms the plating layers 52 by plating metal on the metal layers 51. For example, the manufacturing apparatus plates Ni and Au in this order. Consequently, the plating layers 52 are formed only on the metal layers 51, and the external connection terminals 5 that include the metal layers 51 and the plating layers 52 are completed. Subsequently, the manufacturing apparatus grinds the surface of the second resin layer 9 to adjust the final thickness of the semiconductor device 200. Through the above processes, the semiconductor device 200 is completed.

The semiconductor device 200 according to the second embodiment includes the circuit substrate 1, the external connection terminals 5, the first resin layer 7, the second resin layer 9, the first semiconductor element 10, the second semiconductor element 50, the first SMD component 60, and the second SMD component 70 as described above as in the semiconductor device 100 according to the first embodiment. Consequently, the semiconductor device 200 can improve the radio frequency characteristics of the first semiconductor element 10 and can improve the heat dissipation of the first semiconductor element 10.

The semiconductor device 200 also includes the third resin layer 16 that is disposed on the first semiconductor element 10. The first resin layer 7 (resin dam) surrounds the third resin layer 16. For example, the third resin layer 16 is placed in the recessed portion H1 above the first semiconductor element 10. This enables the first semiconductor element 10 to be protected by the third resin layer 16.

The first resin layer 7 and the third resin layer 16 are flush with each other. This enables flatness near the back surface 1b of the circuit substrate 1 to be improved. This makes it easy to mount the semiconductor device 200 on an external substrate by surface mounting with a portion near the back surface 1b of the circuit substrate 1 facing the external substrate.

The relative dielectric constant of the third resin layer 16 is lower than the relative dielectric constant of Si. This enables the semiconductor device 200 to improve the radio frequency characteristics of the first semiconductor element 10 unlike the case where the support substrate 13 remains on the insulating layer 12.

The resistivity of the third resin layer 16 is higher than the resistivity of Si. This enables the semiconductor device 200 to improve the radio frequency characteristics of the first semiconductor element 10 unlike the case where the support substrate 13 remains on the insulating layer 12.

Thermal conductivity of the third resin layer 16 is higher than the thermal conductivity of $SiO_2$. This enables the semiconductor device 200 to improve the heat dissipation of the first semiconductor element 10 unlike the case where $SiO_2$ is placed on the insulating layer 12 (for example, in the case where the insulating layer 12 composed of $SiO_2$ has the same degree of thickness as that of the third resin layer 16).

What is claimed is:

1. A semiconductor device comprising:
    a substrate that has a first surface and a second surface that is located opposite the first surface;
    a first element that is disposed on the first surface; and
    a first resin layer that is disposed on the first surface and that is disposed around the first element in a plan view, wherein
    the substrate includes a glass epoxy substrate and a wiring layer,
    the first element includes
        a semiconductor layer on the first resin layer, such that portions of the semiconductor layer are in contact with the first resin layer, and the first resin layer is between the semiconductor layer and the substrate,
        an electrode portion that is located on a surface of the semiconductor layer facing the substrate, and
        an insulating layer that is located opposite the electrode portion with the semiconductor layer interposed therebetween,
    the electrode portion is connected to the wiring layer, and
    a height of the first resin layer from the first surface is more than a height of the first element from the first surface.

2. The semiconductor device according to claim 1, wherein
    the first resin layer is in close contact with a side surface of the first element.

3. The semiconductor device according to claim 2, wherein
    the first resin layer is filled between the first element and the substrate.

4. The semiconductor device according to claim 2, wherein
    a relative dielectric constant of the first resin layer is 4 or less.

5. The semiconductor device according to claim 2, wherein
    the first resin layer is composed of thermosetting resin.

6. The semiconductor device according to claim 2, further comprising:
    an external connection terminal that is disposed on the first surface,
    wherein a height of the external connection terminal from the first surface is equal to the height of the first resin layer from the first surface or more than the height of the first resin layer from the first surface.

7. The semiconductor device according to claim 2, further comprising:
   a second element that is disposed on the second surface; and
   a second resin layer that is disposed on the second surface and that covers the second element.

8. The semiconductor device according to claim 2, further comprising:
   a third element that is disposed on the first surface,
   wherein the third element is covered by the first resin layer.

9. The semiconductor device according to claim 1, wherein
   the first resin layer is filled between the first element and the substrate.

10. The semiconductor device according to claim 1, wherein
   a relative dielectric constant of the first resin layer is 4 or less.

11. The semiconductor device according to claim 1, wherein
   the first resin layer is composed of thermosetting resin.

12. The semiconductor device according to claim 1, further comprising:
   an external connection terminal that is disposed on the first surface,
   wherein a height of the external connection terminal from the first surface is equal to the height of the first resin layer from the first surface or more than the height of the first resin layer from the first surface.

13. The semiconductor device according to claim 1, further comprising:
   a second element that is disposed on the second surface; and
   a second resin layer that is disposed on the second surface and that covers the second element.

14. The semiconductor device according to claim 1, further comprising:
   a third element that is disposed on the first surface,
   wherein the third element is covered by the first resin layer.

15. The semiconductor device according to claim 1, further comprising:
   a third resin layer that is disposed on the first element,
   wherein the first resin layer surrounds the third resin layer.

16. The semiconductor device according to claim 15, wherein
   the first resin layer and the third resin layer are flush with each other.

17. The semiconductor device according to claim 15, wherein
   a relative dielectric constant of the third resin layer is lower than a relative dielectric constant of silicon (Si).

18. The semiconductor device according to claim 15, wherein resistivity of the third resin layer is higher than resistivity of silicon (Si).

19. The semiconductor device according to claim 15, wherein thermal conductivity of the third resin layer is higher than thermal conductivity of silicon dioxide ($SiO_2$).

* * * * *